(12) United States Patent
Liu

(10) Patent No.: US 10,798,328 B2
(45) Date of Patent: Oct. 6, 2020

(54) IMAGE SENSOR INCLUDING PIXEL CIRCUITS

(71) Applicant: TAIWAN SEMICONDUCTOR MANUFACTURING CO., LTD., Hsinchu (TW)

(72) Inventor: Chih-Min Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/198,563

(22) Filed: Nov. 21, 2018

(65) Prior Publication Data
US 2019/0098243 A1 Mar. 28, 2019

Related U.S. Application Data

(62) Division of application No. 14/942,750, filed on Nov. 16, 2015, now Pat. No. 10,165,213.

(51) Int. Cl.
*H04N 5/3745* (2011.01)
*H01L 27/146* (2006.01)
(Continued)

(52) U.S. Cl.
CPC ..... *H04N 5/3745* (2013.01); *H01L 27/14609* (2013.01); *H01L 27/14649* (2013.01); *H04N 5/378* (2013.01); *G01S 7/4914* (2013.01)

(58) Field of Classification Search
CPC ............ H04N 5/3745; H04N 5/378; H01L 27/14609; H01L 27/14649
See application file for complete search history.

(56) References Cited

U.S. PATENT DOCUMENTS 7,916,195 B2  3/2011  Kudoh
8,089,036 B2  1/2012  Manabe
(Continued)

FOREIGN PATENT DOCUMENTS

CN   101616276 A   12/2009
CN   102354698 A   2/2012
(Continued)

OTHER PUBLICATIONS

A Teledyne Technologies Company, "The Evolution of CMOS Imaging Technology", 2011, Teledyne DALSA.
(Continued)

*Primary Examiner* — Tony Ko
(74) *Attorney, Agent, or Firm* — Maschoff Brennan

(57) ABSTRACT

A circuit includes sensing unit, first and second group of switches, capacitor, and readout circuit. The sensing unit is configured to receive light and generate sensing voltage at sensing node in response to the light. The first group of switches is coupled to the sensing node, and configured to generate first transfer voltage to first node and generate first auxiliary voltage to second node. The second group of switches is coupled to the sensing node, and configured to generate second transfer voltage to third node and generate second auxiliary voltage to fourth node. The capacitor is coupled to the first group of switches, and configured to store charges generated from the sensing unit. The readout circuit is configured to read at least one of the first transfer voltage and the first auxiliary voltage, and read at least one of the second transfer voltage and the second auxiliary voltage.

20 Claims, 13 Drawing Sheets

(51) Int. Cl.
*H04N 5/378* (2011.01)
*G01S 7/4914* (2020.01)

(56) References Cited

U.S. PATENT DOCUMENTS

| | | |
|---|---|---|
| 8,446,499 B2 | 5/2013 | Kamiyama |
| 8,575,531 B2 | 11/2013 | Hynecek et al. |
| 8,642,938 B2 | 2/2014 | Bikumandla et al. |
| 8,804,017 B2 | 8/2014 | Sato et al. |
| 8,908,073 B2 | 12/2014 | Minagawa et al. |
| 8,952,795 B2 | 2/2015 | Xu et al. |
| 8,994,867 B2 | 3/2015 | Wang et al. |
| 2008/0210986 A1 | 9/2008 | Mauritzson |
| 2009/0309008 A1 | 12/2009 | Lee |
| 2013/0057744 A1 | 3/2013 | Minagawa et al. |
| 2014/0062599 A1 | 3/2014 | Xu et al. |
| 2015/0201140 A1 | 7/2015 | Solhusvik et al. |
| 2016/0241795 A1 | 8/2016 | Nishihara |
| 2018/0020172 A1* | 1/2018 | Hirota .................. H04N 5/3745 |

FOREIGN PATENT DOCUMENTS

| | | |
|---|---|---|
| EP | 2 879 376 A1 | 6/2015 |
| JP | 2011-082859 A | 4/2011 |
| KR | 10-2014-0113225 A | 9/2014 |
| TW | 200824110 A | 6/2008 |
| TW | 201515204 A | 4/2015 |

OTHER PUBLICATIONS

Seong-Jin, K., et al., "A Three-Dimensional Time-of-Flight CMOS Image Sensor With Pinned-Photodiode Pixel Structure", IEEE Electron Device Letiers, vol. 31, Issue 11, pp. 1272-1274 (Nov. 2010).

* cited by examiner

IMAGE SENSOR INCLUDING PIXEL CIRCUITS

RELATED APPLICATION

This application is a divisional of U.S. application Ser. No. 14/942,750, filed Nov. 16, 2015, the disclosure of which is hereby incorporated by reference herein in its entirety.

BACKGROUND

An active-pixel sensor (APS) is an image sensor including an integrated circuit containing an array of pixel sensors, each pixel containing a photodetector and an active amplifier. The CMOS APS are used most commonly in cell phone cameras, web cameras and in some Digital single-lens reflex (DSLR) cameras. Such image sensor is produced by a CMOS process, and is also known as a CMOS image sensor (CIS). In some applications, to capture more information of an image, high dynamic range techniques are utilized in the image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
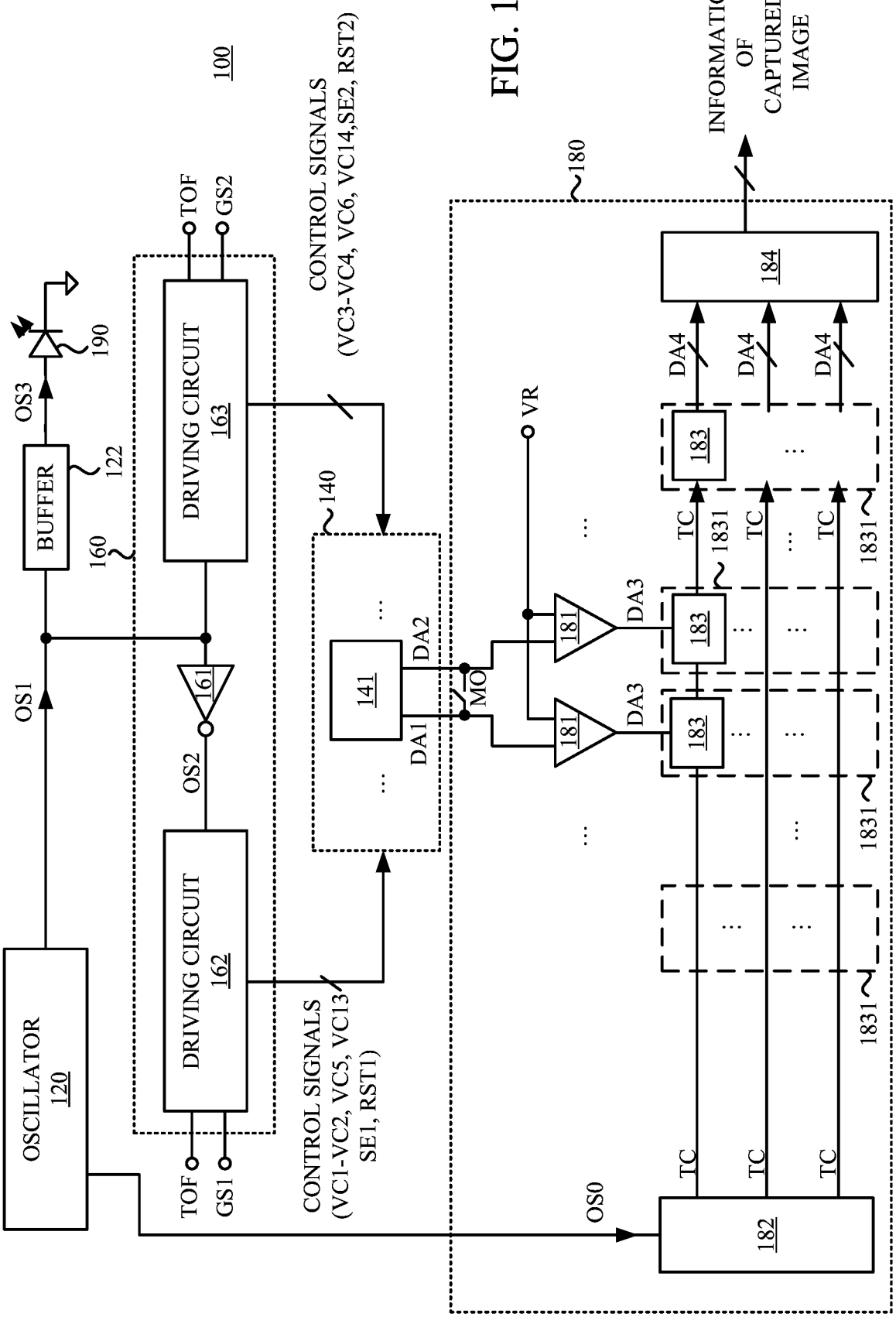
FIG. 1 is a schematic diagram of an electronic device, in accordance with various embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of an electronic device 100, in accordance with various embodiment of the present disclosure.

As illustratively shown in FIG. 1, the electronic device 100 includes an oscillator 120, an image sensor 140, a row driver 160, and a column readout circuit 180. The oscillator 120 is configured to generate an oscillating signal OS0 to the column readout circuit 180, and generate an oscillating signal OS1 to the row driver 160. In some embodiments, the oscillator 120 is implemented with at least one phase locked loop, at least one frequency divider, and at least one delay cell.

Figure 2:
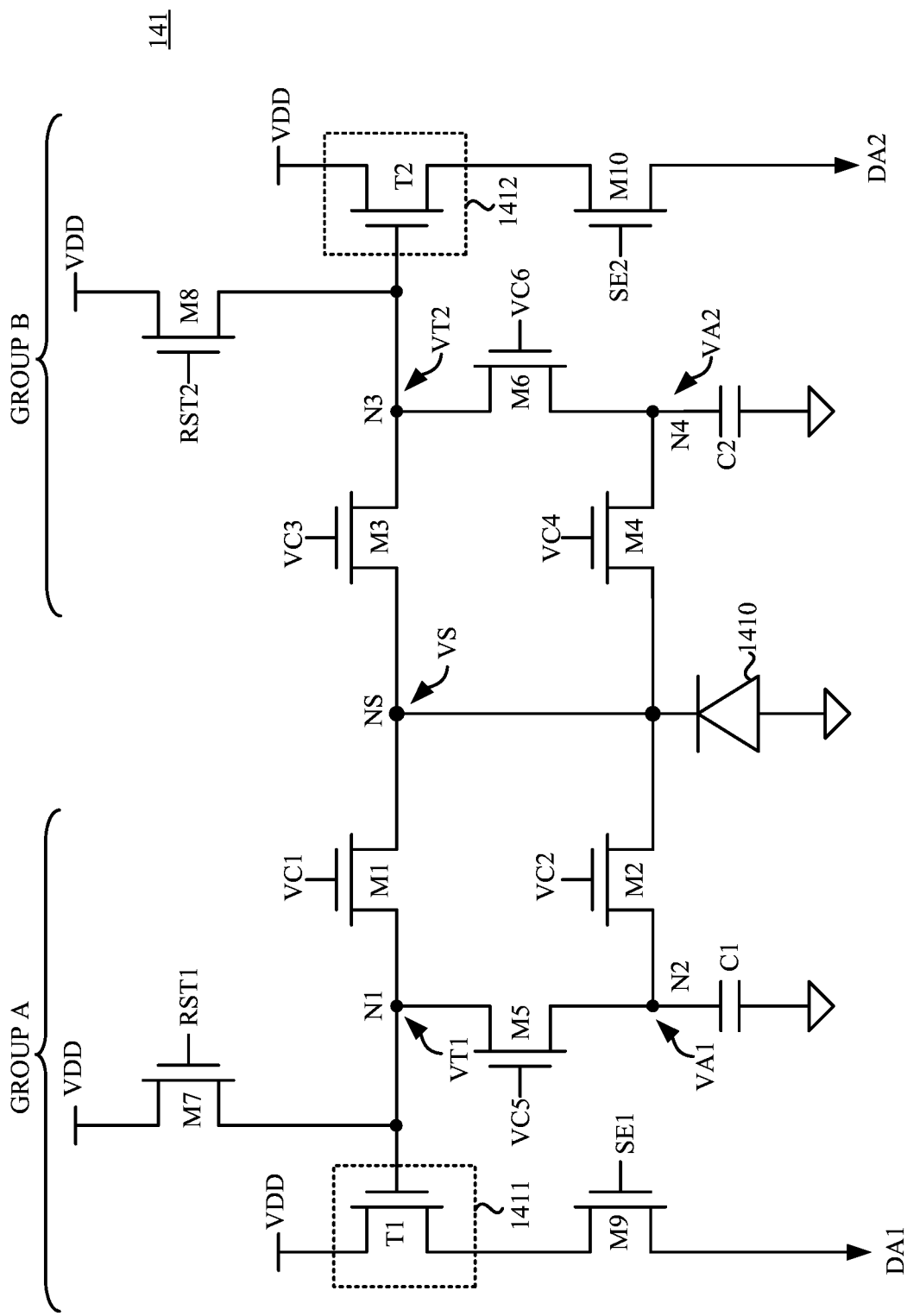
FIG. 2 is a schematic diagram of the pixel in FIG. 1, in accordance with various embodiments of the present disclosure.

In some embodiments, the image sensor 140 is configured to capture images. In some other embodiments, the image sensor 140 is configured to detect objects. In some embodiments, the image sensor 140 includes pixels 141 that are arranged in rows and columns. For simplicity, FIG. 1 only illustrates one pixel 141 as an example. The pixels 141 are configured to receive light and accumulate charges in response to the light, to generate a sensing voltage, for example, the sensing voltage VS as illustrated in FIG. 2 below. In some embodiments, the pixels 141 are able to output data signals DA1-DA2 to the column readout circuit 180 according to the sensing voltage.

Figure 3A:
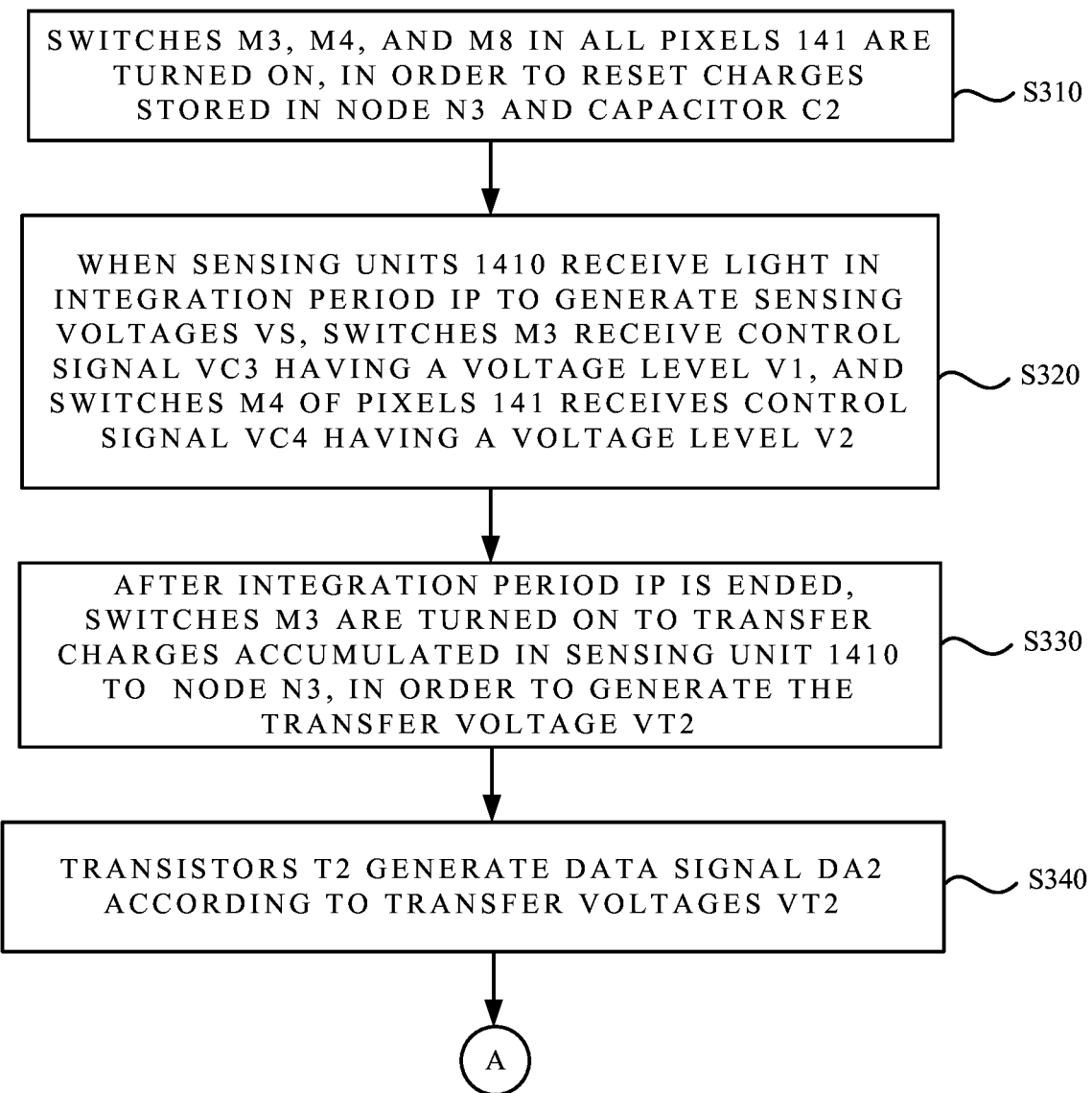
FIGS. 3A-3B are flow charts of a method 300 illustrating operations of the electronic device in FIG. 1 at a first mode and the pixel in FIG. 2, in accordance with various embodiments of the present disclosure.
Figure 3B:
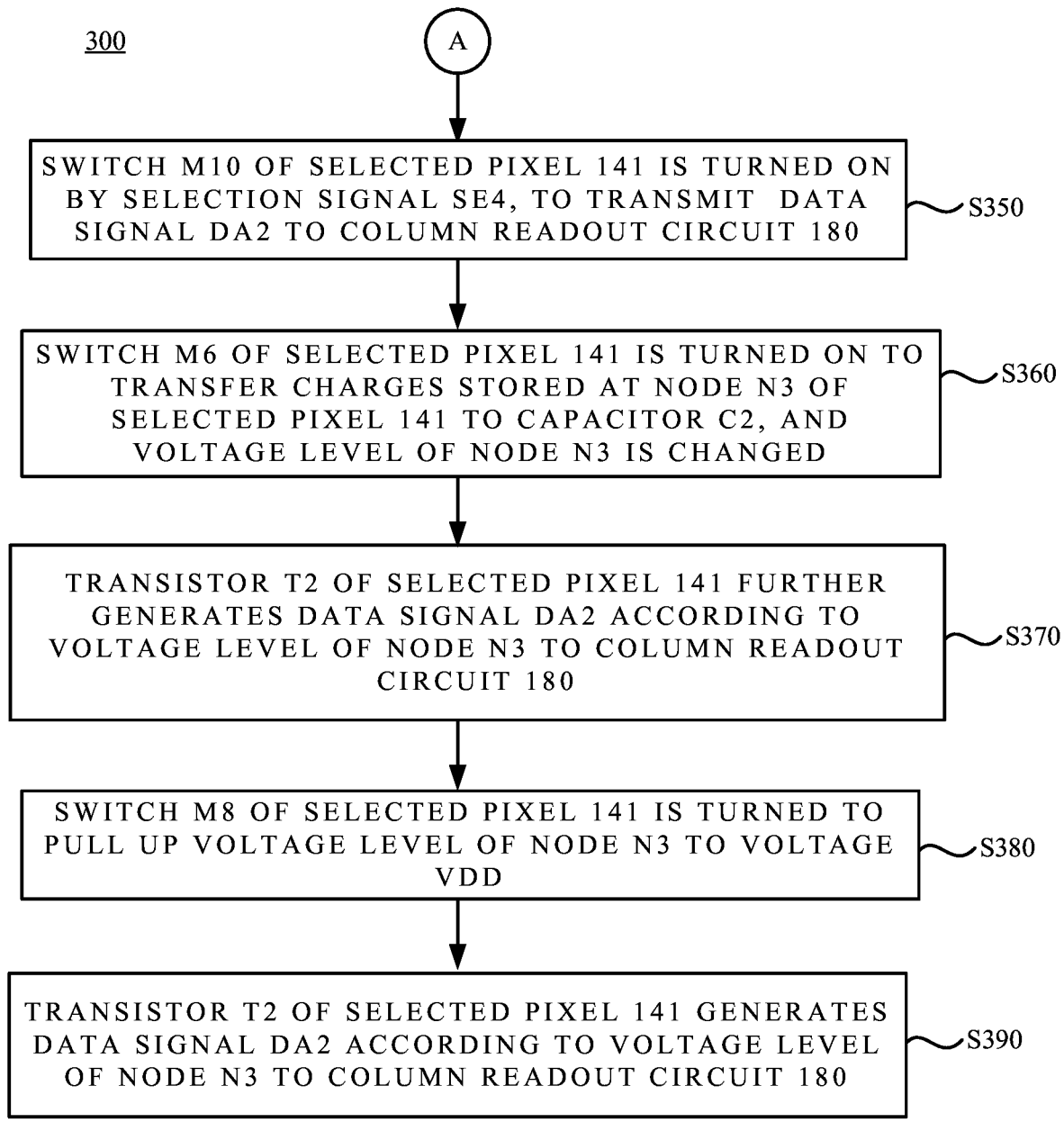
Figure 4A:
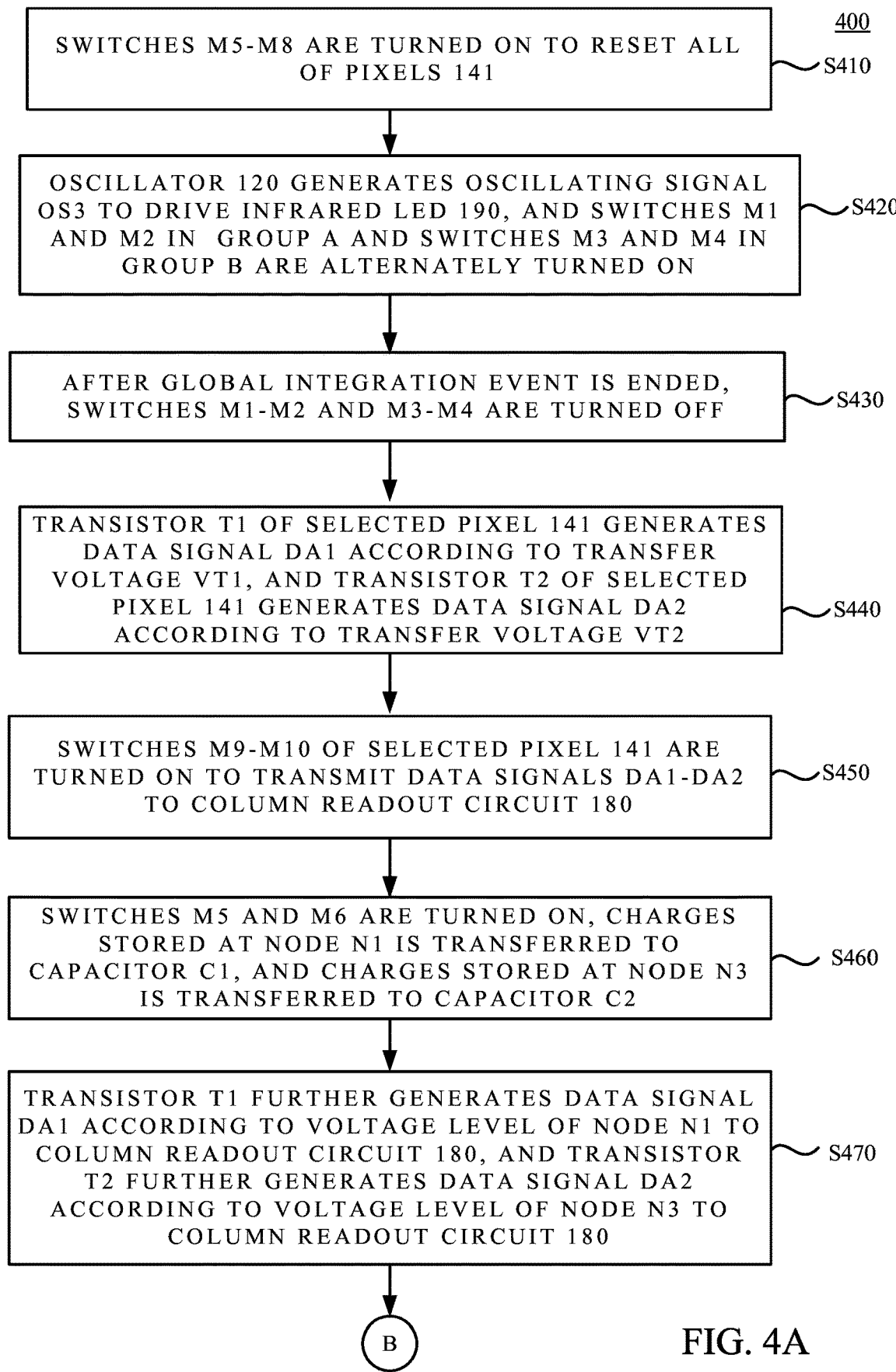
FIGS. 4A-4B are flow charts of a method illustrating operations of the electronic device in FIG. 1 at a second mode and the pixel in FIG. 2, in accordance with various embodiments of the present disclosure.
Figure 4B:
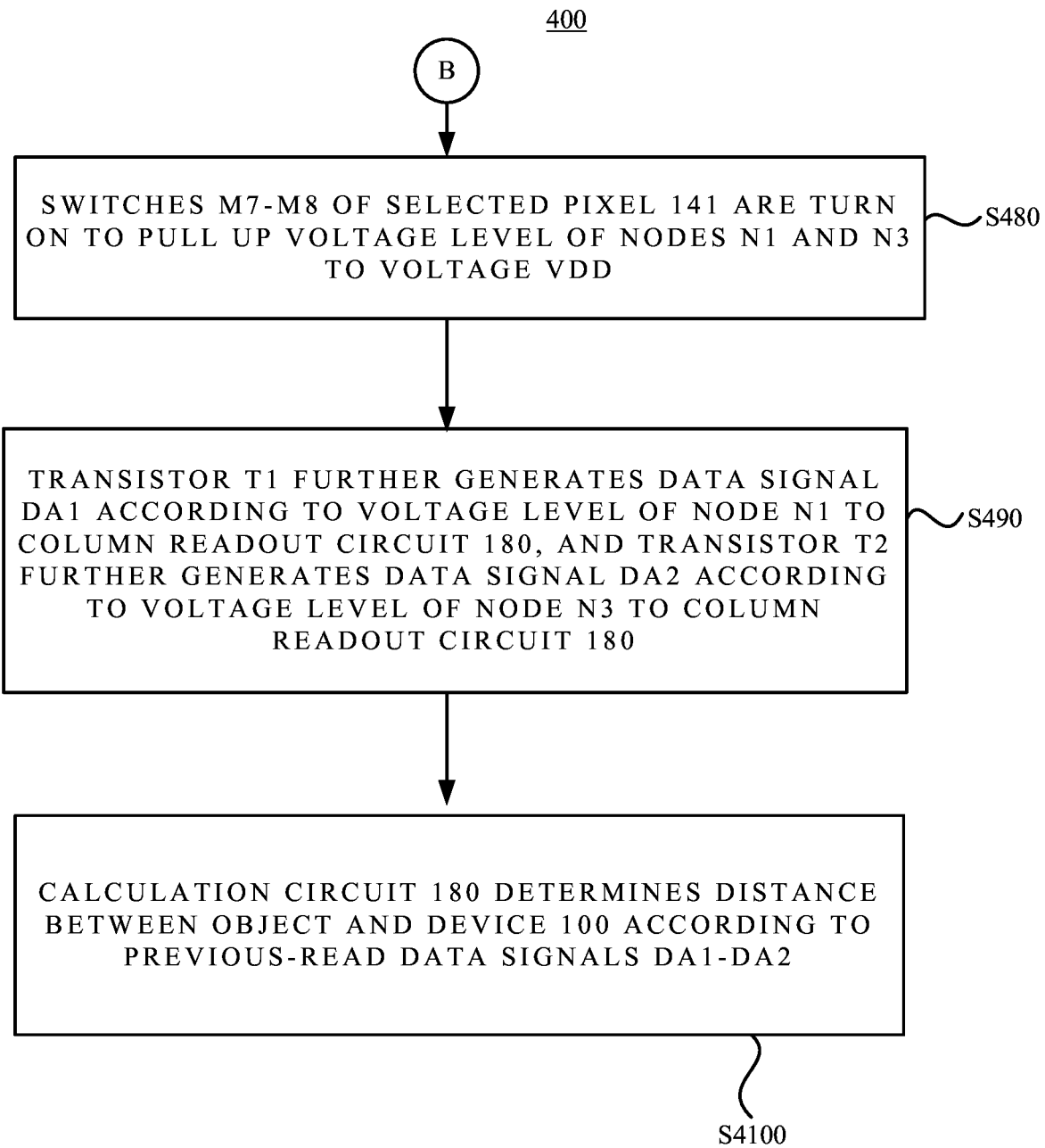

The row driver 160 is configured to receive the oscillating signal OS1, and then generate control signals, for example, including the control signals VC1-VC6, the reset signals RST1-2, and the selection signals SE1-2 as illustrated in FIG. 2 below, to the pixels 141, in order to perform a capturing operation or a read operation. In some embodiments, the row driver 160 is configured to control the pixels 141 to operate at different modes. For illustration of FIG. 1, the row driver 160 includes an inverter 161, a driving circuit 162, and a driving circuit 163. The inverter 161 is configured to receive the oscillating signal OS1, and accordingly output an oscillating signal OS2. In other words, the oscillating signal OS1 and the oscillating signal OS2 are configured to be different in phase by about 180 degrees. The driving circuit 162 is configured to generate control signals VC1, VC2, VC5, and VC13, a selection signal SE1, a reset signal RST1 to according to mode signals TOF and GS1 and the oscillating signal OS2. The driving circuit 163 is configured to generate control signals VC3, VC4, VC6, and VC14, a selection signal SE2, a reset signal RST2 to according to mode signals TOF and GS2, and the oscillating signal OS1. In some embodiments, the electronic device 100 is configured to operate in a first mode, as illustrated in FIGS. 3A-3B below, or a second mode, as illustrated in FIGS. 4A-4B below, according to the mode signals GS1-GS2, and TOF. Detailed operations are described below.

In some embodiments, the driving circuit 162 and the driving circuit 163 are implemented with various types of digital circuits. For example, in further embodiments, the digital circuits include at least one AND gate, at least one multiplexer, and/or at least one buffer. The arrangement of the row driver 160 is given for illustrative purposes only. Various arrangements of the row driver 160 are within the contemplated scope of the present disclosure.

The column readout circuit 180 is configured to readout the data signals DA1-DA2 from a selected one of the pixels 141. In some embodiments, the column readout circuit 180 includes comparators 181, a counter 182, data alignment circuits 183, and a calculation circuit 184. The comparators 181 are coupled to the columns of the image sensor 140 to receive the data signals DA1 or DA2, and configured to compare the data signals DA1 or DA2 with a ramp voltage VR, in order to generate data signals DA3. The counter 182 is configured to output counter signals TC to the data alignment circuits 183 according to the oscillating signal OS0. In some embodiments, the counter 182 is implemented with at least one ripple counter, at least one delay circuit, and at least one encoder. In some embodiments, the data-alignment circuits 183 are disposed in a column pitch 1831. In some embodiments, each pixel 141 is coupled to one column pitches 1831. In some alternative embodiments, each pixel 141 is coupled to at least two column pitches 1831. The data-alignment circuits 183 are configured to sequentially latch values of the data signals DA3 at different times, and then simultaneously transfer the latched values of the data signal DA3 as data signals DA4 to the calculation circuit 184. The calculation circuit 184 is configured to decode the data signals DA4 transmitted from the data alignment circuits 183, in order to obtain information of the captured image. In some embodiments, the calculation circuit 184 is implemented with at least one sense amplifier and at least one decoder.

The arrangement of the column readout circuit 180 is given for illustrative purposes only. Various arrangements of the column readout circuit 180 are within the contemplated scope of the present disclosure.

FIG. 2 is a schematic diagram of the pixel 141 in FIG. 1, in accordance with various embodiments of the present disclosure.

As illustratively shown in FIG. 2, the pixel 141 includes a sensing unit 1410, switches M1-M10, capacitors C1 and C2, and output stages 1411 and 1412. The sensing unit 1410 is coupled between a sensing node NS and ground. The sensing unit 1410 is configured to accumulate charges in response to light, in order to generate the sensing voltage VS at the sensing node NS. In some embodiments, as illustrated in FIG. 2, the sensing unit 1410 includes a photodiode.

In some embodiments, the switches M1-M10 are divided into a group A and a group B. For illustration, the switches M1-M2, M5, M7, and M9 are arranged in the group A, and the switches M3-M4, M6, M8, and M10 are arranged in the group B.

A first terminal of the switch M1 is coupled to the sensing node NS, and a second terminal of the switch M1 is coupled to a node N1. A control terminal of the switch M1 is coupled to the driving circuit 162 in FIG. 1 to receive the control signal VC1. The switch M1 is configured to generate a transfer voltage VT1 at the node N1 according to the sensing voltage VS. In other words, when being turned on by the control signal VC1, the switch M1 is able to transfer a part of the charges accumulated in the sensing unit 1410 to parasitic capacitances (not shown) coupled to the node N1. Accordingly, the transfer voltage VT1 is generated by the charge stored in the parasitic capacitances coupled to the node N1. A first terminal of the switch M2 is coupled to the sensing node NS, and a second terminal of the switch M2 is coupled to a node N2. A control terminal of the switch M2 is coupled to the driving circuit 162 in FIG. 1 to receive the control signal VC2. The capacitor C1 is coupled between the node N2 and ground. The switch M2 is configured to generate an auxiliary voltage VA1 at the node N2 according to the sensing voltage VS. In other words, when being turned on by the control signal VC2, the switch M2 is able to transfer a part of the charges accumulated in the sensing unit 1410 to the capacitor C1. Accordingly, the auxiliary voltage VA1 is thus generated by the charges stored in the capacitor C1.

Corresponding to the switch M1, a first terminal of the switch M3 is coupled to the sensing node NS, and a second terminal of the switch M3 is coupled to a node N3. A control terminal of the switch M3 is coupled to the driving circuit 163 in FIG. 1 to receive the control signal VC3. The switch M3 is configured to generate a transfer voltage VT2 at the node N3 according to the sensing voltage VS. In other words, when being turned on by the control signal VC3, the switch M3 is able to transfer a part of the charges accumulated in the sensing unit 1410 to parasitic capacitances (not shown) coupled to the node N3. Accordingly, the transfer voltage VT2 is generated by the charge stored in the parasitic capacitances coupled to the node N3. Corresponding to the switch M2, a first terminal of the switch M4 is coupled to the sensing node NS, and a second terminal of the switch M4 is coupled to a node N4. A control terminal of the switch M4 is coupled to the driving circuit 163 in FIG. 1 to receive the control signal VC4. The capacitor C2 is coupled between the node N4 and ground. The switch M4 is configured to generate an auxiliary voltage VA2 at the node N4 according to the sensing voltage VS. In other words, when being turned on by the control signal VC4, the switch M4 is able to transfer a part of the charges accumulated in the sensing unit 1410 to the capacitor C2. Accordingly, the auxiliary voltage VA2 is generated by the charges stored in the capacitor C2.

Moreover, a first terminal of the switch M5 is coupled to the node N1, and a second terminal of the switch M5 is coupled to the node N2. A control terminal of the switch M5 is coupled to the driving circuit 162 in FIG. 1 to receive the control signal VC5. The switch M5 is configured to be turned on by the control signal VC5, to transfer the charges stored at the node N1 to the capacitor C1. Accordingly, the amount of the charges stored in the capacitor C1 is increased. As a result, when the switch M5 is turned on, the voltage level at the node N1, i.e., the transfer voltage VT1, is effectively increased.

Corresponding to the switch M5, a first terminal of the switch M6 is coupled to the node N3, and a second terminal of the switch M6 is coupled to the node N4. A control terminal of the switch M6 is coupled to the driving circuit 163 in FIG. 1 to receive the control signal VC6. The switch M6 is configured to be turned on by the control signal VC6, to transfer the charges stored at the node N3 to the capacitor C2. Accordingly, the amount of the charges stored in the capacitor C2 is increased. As a result, when the switch M6 is turned on, the voltage level at the node N3, i.e., the transfer voltage VT2, is effectively increased.

A first terminal of the switch M7 is coupled to a power source to receive a voltage VDD, and a second terminal of the switch M7 is coupled to the node N1. A control terminal of the switch M7 is coupled to the driving circuit 162 in FIG. 1 to receive the reset signal RST1. The switch M7 is configured to be turned on according to the reset signal RST1, in order to pull up the voltage level of the node N1 to the voltage VDD. In some embodiments, during a reset operation, the switch M7 and the switch M5 are turned on. The voltage VDD is thus transmitted to the node N1 and the node N2. Accordingly, the charges stored at the node N1 and the charges stored in the capacitor C1 are attracted by the voltage VDD. Effectively, the pixel 141 is reset.

Corresponding to the switch M7, a first terminal of the switch M8 is coupled to the power source to receive the voltage VDD, and a second terminal of the switch M8 is coupled to the node N3. A control terminal of the switch M8 is coupled to the driving circuit 163 to receive the reset signal RST2. The switch M8 is configured to be turned on according to the reset signal RST2, in order to pull up the voltage level of the node N3 to the voltage VDD. In some embodiments, during the reset operation, the switch M8 and the switch M6 are turned on. The voltage VDD is thus transmitted to the node N3 and the node N4. Accordingly, the charges stored at the node N3 and the charges stored in the capacitor C2 are attracted by the voltage VDD. Effectively, the pixel 141 is reset.

In some embodiments, the output stage 1411 is configured to generate the data signal DA1 according to the voltage level of the node N1. For illustration of FIG. 2, in some embodiments, the output stage 1411 is a source follower that includes a transistor T1. A first terminal of the transistor T1 is coupled to the power source to receive the voltage VDD, a second terminal of the transistor T1 is configured to generate the data signal DA1, and a control terminal of the transistor T1 is coupled to the node N1. When the switch M5 is not turned on, the transistor T1 generates the data signal DA1 according to the transfer voltage VT1. Under this condition, the data signal DA1 is configured to indicate the amount of the charges stored at the node N1. Alternatively, when switch M5 is turned on, the transistor T1 generates the data signal DA1 according to the voltage level of the node N1. Under this condition, as described above, the data signal DA1 is able to indicate the amount of the charges stored at the node N1 and that stored in the capacitor C1.

Corresponding to the output stage 1411, in some embodiments, the output stage 1412 is configured to generate a data signal DA2 according to the voltage level of the node N3. For illustration of FIG. 2, the output stage 1412 is a source follower that includes a transistor T2. A first terminal of the transistor T2 is coupled to the power source to receive the voltage VDD, a second terminal of the transistor T2 is configured to generate the data signal DA2, and a control terminal of the transistor T2 is coupled to the node N3. When the switch M6 is not turned on, the transistor T2 generates the data signal DA2 according to the transfer voltage VT2. Under this condition, the data signal DA2 is able to indicate the amount of the charges stored at the node N3. Alternatively, when switch M6 is turned on, the transistor T2 generates the data signal DA2 according to the voltage level of the node N3. Under this condition, as described above, the data signal DA2 is able to indicate the amount of the charges stored at the node N3 and that stored in the capacitor C2.

A first terminal of the switch M9 is coupled to the second terminal of the transistor T1 to receive the data signal DA1, and a second terminal of the switch M9 is coupled to one of the comparators 181 in FIG. 1. A control terminal of the switch M9 is coupled to the driving circuit 162 to receive the selection signal SE1. The switch M9 is configured to be turned on according to the selection signal SE1 to transmit the data signal DA1 to the comparator 181 in FIG. 1. A first terminal of the switch M10 is coupled to the second terminal of the transistor T2 to receive the data signal DA2, and a second terminal of the switch M10 is coupled to one of the comparators 181 in FIG. 1. A control terminal of the switch M10 is coupled to the driving circuit 163 to receive the selection signal SE2. The switch M10 is configured to be turned on according to the selection signal SE2 to transmit the data signal DA2 to the comparator 181 in FIG. 1.

In some embodiments, the switches M1-M4 and the sensing unit 1410 are implemented on the same wafer. In some other embodiments, the switches M1-M4 and the sensing unit 1410 are implemented on different wafers with a 3D CMOS image chip (CIS) technology. In some embodiments, the sensing unit 1410 is formed with a semiconductor structure, and the switches M1-M4 are stacked at four corners upon the sensing unit 1410. In some still embodiments, the switches M1-M4 are stacked at two sides upon of the sensing unit 1410. In some embodiments, the switches M1-M4 are stacked at four edges upon the sensing unit 1410.

The arrangements of the pixel 141 are given for illustrative purposes only. Various arrangements of the pixel 141 are within contemplated scope of the present disclosure.

Figure 3C:
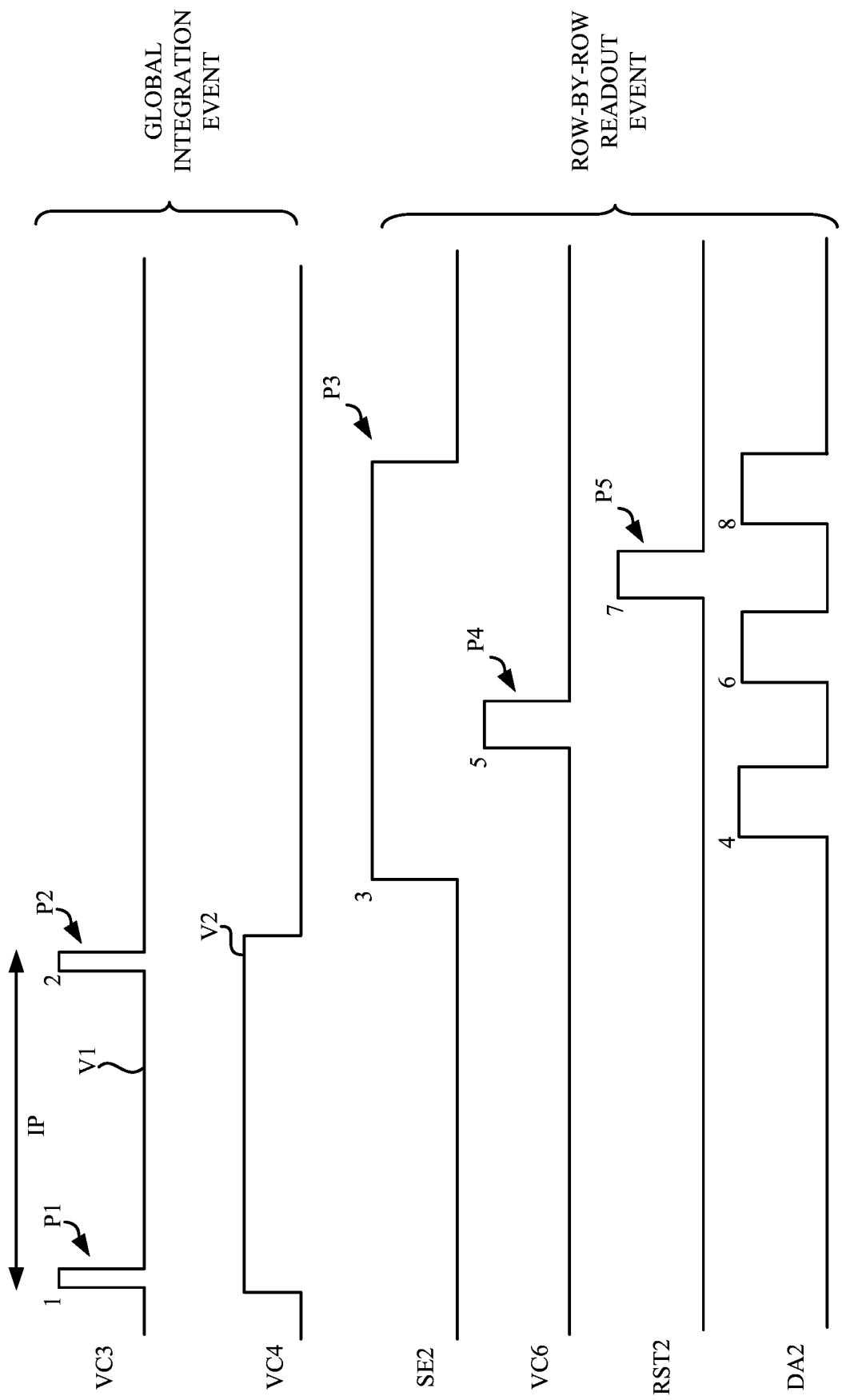
FIG. 3C is a timing diagram illustrating operations in FIGS. 3A-3B, in accordance with various embodiments of the present disclosure.

FIGS. 3A-3B are flow charts of a method 300 illustrating operations of the electronic device 100 in FIG. 1 at a first mode and the pixel 141 in FIG. 2, in accordance with various embodiments of the present disclosure. FIG. 3C is a timing diagram illustrating operations in FIGS. 3A-3B, in accordance with various embodiments of the present disclosure.

For illustration, the operations of the device 100 in FIG. 1 are described by the method 300 with reference to FIGS. 1-2, 3A-3C. In some embodiments, the method 300 includes operations S310-S390.

In operation S310, the switches M3, M4, and M8 in all pixels 141 are turned on, in order to reset the charges stored in the node N3 and capacitor C2. Effectively, the pixels 141 of the image sensor 140 are reset.

In operation S320, when the sensing units 1410 of all pixels 141 receive the light in an integration period IP to generate the sensing voltages VS, the switches M3 of the pixels 141 receive the control signal VC3 having a voltage level V1, and the switches M4 of the pixels 141 receive the control signal VC4 having a voltage level V2.

For illustration of FIG. 3C, at time 1, the control signal VC3 is transited to have a pulse P1 to indicate that the device 100 in FIG. 1 enters a global integration event. In the global integration event, the pixels 141 of the image sensor 140 are configured to receive light, in order to capture an image. In some embodiments, during the integration period IP of the global integration event, the control signals VC3 are globally transited to the voltage level V1, which is, for example, a low level as illustrated in FIG. 3C, to turn off the switches M3 in the image sensor 140 in FIG. 1. Meanwhile, the control signals VC4 are globally transited to the voltage level V2, which is, for example, higher than first voltage level V1, to slightly turn off the switches M4 in the image sensor 140 in FIG. 1. With such configurations, during the global integration period IP, the equivalent resistance of the switch M4 is sufficient to allow the charges accumulated by the sensing unit 1410 to be transferred to the capacitor C2, in order to generate the auxiliary voltage VA2. For example, during the global integration period IP, if the pixel 141 is in a strong illumination, the charges accumulated in the sensing unit 1410 would be saturated, extra charges are thus able to be leaked from the sensing unit 1410 to the capacitor C2 through the switch M4. Effectively, additional lighting information of the captured image is able to be stored in the capacitors C2 of the pixels 141.

With continued reference to FIG. 3A, in operation S330, after the integration period IP is ended, the switches M3 are turned on to transfer the charges accumulated in the sensing unit 1410 to the node N3, in order to generate the transfer voltage VT2. In operation S340, the transistors T2 generate the data signals DA2 according to the transfer voltages VT2.

For illustration of FIG. 3C, at time 2, the control signal VC3 to have a pulse P2 to turn on the switches M3. Accordingly, the charges stored, which are accumulated during the integration period IP, in the sensing unit 141 are able to be transferred to the node N3. Accordingly, the voltage level of the node N3 is pulled up to generate the transfer voltage VT2. The transistor T2 then generates the data signal DA2 in response to the transfer voltage VT2. Effectively, the data signal DA2 is able to indicate the amount of the charges stored at the node N2. In some alternative embodiments, during the integration period IP, the switch M3 is configured to be periodically turned on and off by the control signal VC3, to transfer the charges from the sensing unit 1410 to the node N3.

Reference is now made to FIG. 3B, in operation S350, the switch M10 of the selected pixel 141 is turned on by the selection signal SE4, to transmit the data signal DA2 to the column readout circuit 180. In operations S360, the switch M6 of the selected pixel 141 is turned on to transfer the charges stored at the node N3 of the selected pixel 141 to the capacitor C2, and the voltage level of the node N3 is changed. In operation S370, the transistor T2 of the selected pixel 141 further generates the data signal DA2 according to the voltage level of the node N3 to the column readout circuit 180. In operation S380, the switch M8 of the selected pixel 141 is turned on to pull up the voltage level of the node N3 to the voltage VDD. In operation S390, the transistor T2 of the selected pixel 141 generates the data signal DA2 according to the voltage level of the node N3 to the column readout circuit 180.

For illustration, as shown in FIG. 3C, after the integration period IP, the device 100 enters a row-by-row readout event, and the switches M3 and M4 are turned off. At time 3, the selection signal SE2 of the selected pixel 141 is transited to have a pulse P3 to perform a read operation. In the row-by-row read event, data signals DA1 or DA2 of the pixels 141 are configured to be sequentially read by the column readout circuit 180. At time 4, the column readout circuit 180 reads the data signal DA2 that indicates the amount of the charges stored at the node N2. In some embodiments, the data signal DA2 read at time 4 corresponds to the information of the captured image in a low illumination or a normal illumination. At time 5, the control signal VC6 is transited to have a pulse P4 to turn on the switch M6. The charges stored at the node N3 are transferred to the capacitor C2 via the switch M6. In other words, the capacitor C2 now stores the charges stored at the node N3 and the charges leaked from the sensing unit 1410 at operation S320. Thus, both the voltage level of the node N4 and the voltage level of the node N3 are increased. Then, the transistor T2 generates the data signal DA2 according to the current voltage level of the node N3. Effectively stated, the data signal DA2 is generated according to both of the transfer voltage VT2 and the auxiliary voltage VA2. At time 6, the column readout circuit 180 reads the data signal DA2 that indicates the amount of the charges stored at the capacitor C2, as mentioned above. In some embodiments, the data signal DA2 read at time 6 corresponds to the information of the captured image in the strong illumination.

At time 7, the reset signal RST2 is transited to have a pulse P5 to turn on the switch M8. The voltage VDD is thus transmitted to the node N3. Charges at the node N3 are attracted by the voltage VDD. Effectively, the voltage level of the node N3 is reset to a reset level. The transistor T2 generates the data signal DA2 in response to the reset level. At time 8, the column readout circuit 180 reads the data signal DA2 that indicates the reset level. In some embodiments, such data signal DA2 is utilized to perform an offset cancellation. For illustration, the calculation circuit 184 in FIG. 1 is further configured to perform the offset cancellation by utilizing the data signal DA2 read at time 8.

In some embodiments, the switches of the group A perform operations S310-S340 while the switches of the group B perform the operations S350-S390. For illustration, when the switches M3, M4, M6, M8, M10, and the transistor T2 of the group B enter the global integration event, as described as operation S310-S320 in FIG. 3A, the switches M1, M2, M7, M9, and the transistor T1 of the group A enter the row-by-row readout event, as described as operation S330-S390 in FIG. 3A, and vice versa. In other words, when one of the group A and the group B is in the global integration event, another one of the group A and the group B is in the row-by-row readout event. For example, when the switches of the group B are in the row-by-row readout event, the switches M7 and M5 are turned on to reset the nodes N1 and N2, which is similar with operation S310 as illustrated above. Then the group A performs operation S320 to capture the image.

In some embodiments, the first mode of the device 100, i.e., the method 300, is referred to as a global shutter mode. With the arrangements of the capacitor C2 and the method 300, extra light information of the captured image is able to be stored. As a result, the device 100 is able to achieve a high dynamic range application.

In some embodiments, as illustrated in FIG. 1, the device 100 further includes a buffer 122 and an infrared light emitting diode (LED) 190. The buffer 122 is configured to generate an oscillating signal OS3 according to the oscillating signal OS1. The infrared LED 190 is driven by the oscillating signal OS3. In some embodiments, the oscillating signal OS3 and the oscillating signal OS1 are configured to be in phase. In some embodiments, the infrared LED 190 is configured to emit infrared light to an object, in order to calculate the distance between the device 100 and the object. In further embodiments, when operating at a second mode, the image sensor 140 is configured to sense the infrared light reflected by the object, and generate the data signals DA1 and DA2 accordingly. The column readout circuit 180 is further configured to calculate the distance between the device 100 and the object according to the data signals DA1 and DA2.

Figure 4C:
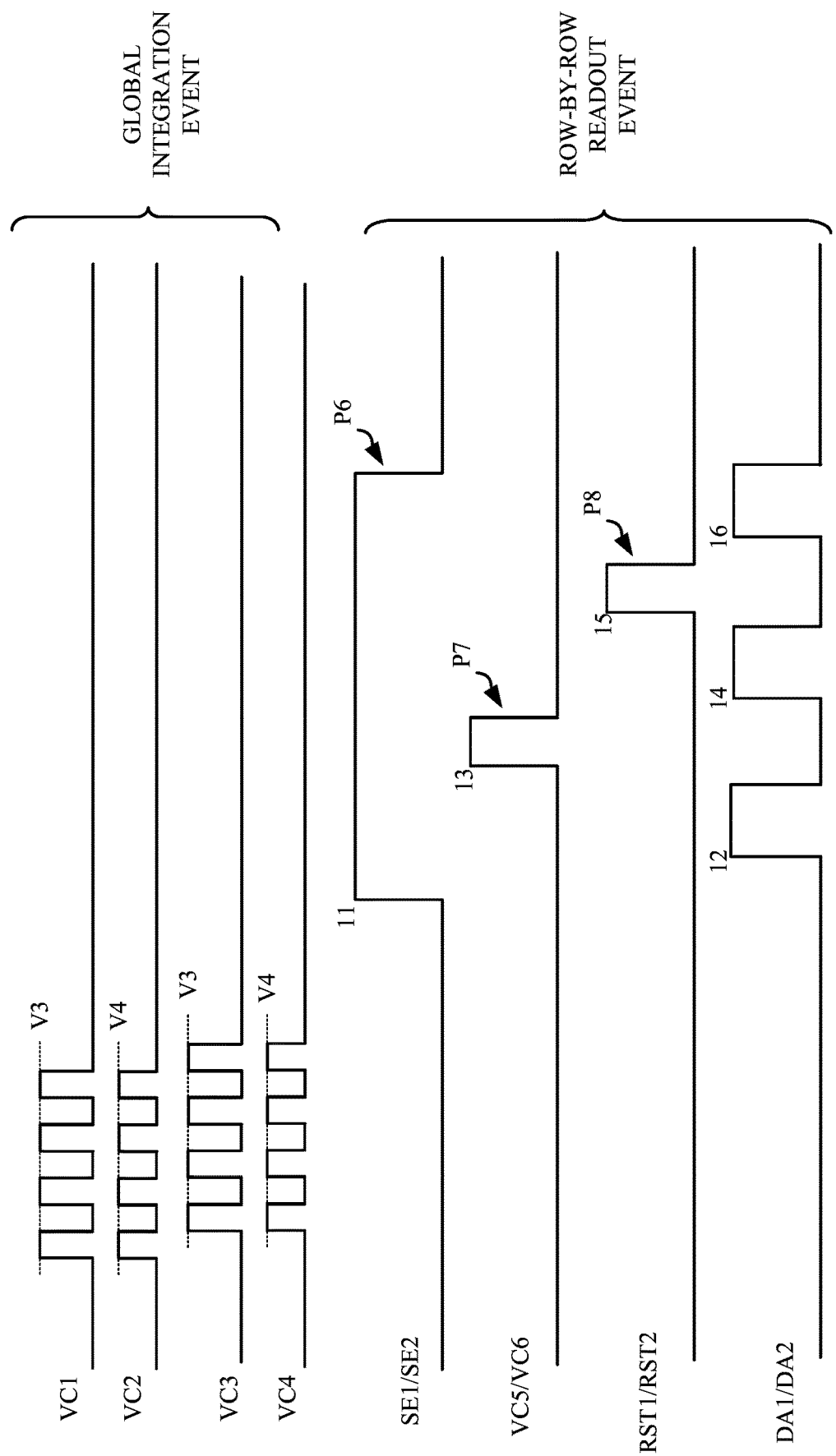
FIG. 4C is a timing diagram illustrating operations in FIGS. 4A-4B, in accordance with various embodiments of the present disclosure.

FIGS. 4A-4B are flow charts of a method 400 illustrating operations of the electronic device 100 in FIG. 1 at a second mode and the pixel 141 in FIG. 2, in accordance with various embodiments of the present disclosure. FIG. 4C is a timing diagram illustrating operations in FIGS. 4A-4B, in accordance with various embodiments of the present disclosure.

For illustration, the operations of the device 100 in FIG. 1 are described by the method 400 with reference to FIGS. 1-2, and 4A-4C. In some embodiments, the method 400 includes operations S410-S4100.

Reference is now made to FIG. 4A. In operation S410, the switches M5-M8 are turned on to reset all of the pixels 141. In operation S420, the oscillator 120 in FIG. 1 generates the oscillating signal OS3 to drive the infrared LED 190, and the switches M1 and M2 in the group A and the switches M3 and M4 in the group B are alternately turned on.

For illustration, during the global integration event, the sensing units 1410 of the pixels 141 in FIG. 2 accumulates the charges in response to the infrared light reflect by the object. As shown in FIG. 4C, during the global integration event, the control signals VC1 and VC2 of the group A are in phase, and the control signals VC3 and VC4 of the group B are in phase. The control signals VC1 and VC2 of the group A and the control signals VC3 and VC4 of the group B are different in phase by about 180 degrees. With such configurations, the switches M1 and M2 in FIG. 2 and the switches M3 and M4 in FIG. 2 are alternately turned on during the global integration event. Thus, during the turn-on time of each switch M1-M2 or M3-M4 in FIG. 2, the charges accumulated by the sensing unit 1410 in FIG. 2 are selectively transmitted to the nodes N1-N2 or the nodes N3-N4 in FIG. 2. Accordingly, the transfer voltages VT1-VT2 and the auxiliary voltages VA1-VA2 are generated during the global integration event.

In some embodiments, when the switches M1 and M2 are turned on, the switch M1 receives the control signal VC1 having a voltage level V3, and the switch M2 receives the control signal VC2 having a voltage level V4 that is different from the voltage level V3. For illustration of FIG. 4C, the voltage level V4 is lower than the voltage level V3. With such configuration, during the global integration event, the switch M1 is turned on, and the switch M2 is slightly turned on. In other words, during the global integration event, the equivalent resistance of the switch M1 is lower than the equivalent resistance of the switch M2. In some embodiments, the turn-on time of each switch in the global integration event are able to be extended, in order to increase a range of detectable distance between the object and the device 100. During the global integration event, if the object was too near the device 100, the charges stored at the node N1 would be saturated. With the configurations of the different voltage levels V3-V4, extra charges are able to be leaked to the node N2 through the switch M2 and stored in the capacitor C1. As a result, the detectable distance range is increased while blooming charges are prevented.

Corresponding to the control signals VC1-VC2, in some embodiments illustrated in FIG. 4C, the configuration of the different voltage levels is also applied to the control signals VC3-VC4. The configurations of the control signals VC3-VC4 and the related operations of the switches M3-M4 in FIG. 2 are similar with the operations described above. Thus, the repetitious descriptions are not given here.

With continued reference to FIG. 4A, in operation S430, after the global integration event is ended, the switches M1-M2 and M3-M4 in FIG. 2 are turned off. In operation S440, the transistor T1 of the selected pixel 141 in FIG. 2 generates the data signal DA1 according to the transfer voltage VT1, and the transistor T2 of the selected pixel 141 generates the data signal DA2 according to the transfer voltage VT2. In operation S450, the switches M9-M10 of the selected pixel 141 in FIG. 2 are turned on to transmit the data signals DA1-DA2 to the column readout circuit 180.

For illustration, after the global integration event is end, the device 100 enters the row-by-row readout event. As shown in FIG. 4C, at time t1, the selection signals SE1-SE2 are transited to have a pulse P6 to turn on the switches M9-M10 in FIG. 2. At time t2, the column readout circuit 180 reads the data signals DA1-DA2, in which the data signals DA1-DA2 indicate the amount of the charges stored at the node N1 and the amount of the charges stored at the node N3, respectively. In some embodiments, the data signals DA1-DA2 read at time t2 correspond to the information of the middle distance between the object and the device 100 in FIG. 1.

With continued reference to FIG. 4A, in operation S460, the switches M5 and M6 are turned on, charges stored at the node N1 is transferred to the capacitor C1, and the charges stored at the node N3 is transferred to the capacitor C2. In operation S470, the transistor T1 further generates the data signal DA1 according to the voltage level of the node N1 to the column readout circuit 180, and the transistor T2 further generates the data signal DA2 according to the voltage level of the node N3 to the column readout circuit 180 in FIG. 1.

For illustration of FIG. 4C, at time t3, the control signals VC5-VC6 are transited to have a pulse P7 to turn the switches M5-M6 in FIG. 2. Accordingly, the charges stored at the node N1 are transferred to the node N2 and stored in the capacitor C1 in FIG. 2. The charges stored at the node N2 are transferred to the node N3 and stored in the capacitor C2 in FIG. 2. In other words, the capacitor C1 in FIG. 2 now stores the charges stored at the node N1 and the charges leaked from the sensing unit 1410 in operation S420. The capacitor C2 in FIG. 2 now stores the charges stored at the node N3 and the charges leaked from the sensing unit 1410 in operation S420. Thus, the voltage level of the node N1 in FIG. 2 and the voltage level of the node N2 in FIG. 2 are thus increased. The transistor T1 in FIG. 2 generates the data signal DA1 according to the current voltage level of the node N1, and the transistor T2 in FIG. 2 generates the data signal DA2 according to the current voltage level of the node N2. Effectively stated, the transistor T1 further generates the data signal DA1 according to both of the transfer voltage VT1 and the auxiliary voltage VAL and the transistor T2 in FIG. 2 further generates the data signal DA2 according to both of the transfer voltage VT2 and the auxiliary voltage VA2. At time t4, the column readout circuit 180 reads the data signals DA1-DA2 for extending the detectable distance.

With continued reference to FIG. 4A, in operation S480, the switches M7-M8 in FIG. 2 of the selected pixel 141 are turned on to pull up the voltage level of the nodes N1 and N3 to the voltage VDD. In operation S490, the transistor T1 in FIG. 2 further generates the data signal DA1 according to the voltage level of the node N1 to the column readout circuit 180, and the transistor T2 further generates the data signal DA2 according to the voltage level of the node N3 to the column readout circuit 180. In operation S4100, the calculation circuit 180 in FIG. 1 determines the distance between the object and the device 100 in FIG. 1 according to the previous-read data signals DA1-DA2.

For illustration of FIG. 4C, at time t5, the reset signals RST1-RST2 are transited to have a pulse P8 to turn the switches M7-M8. The voltage VDD is thus transmitted to the nodes N1 and N3. Charges at the nodes N1 and N3 are attracted by the voltage VDD. Effectively, the voltage level of the nodes N1 and N3 are reset to a reset level. The transistors T1-T2 in FIG. 2 generate the data signals DA1-DA2 in response to the reset level. At time 16, the column readout circuit 180 reads the data signals DA1-DA2 that indicate the reset level. In some embodiments, the data signals DA1-DA2, which indicate the reset level, are utilized to perform the offset cancellation by the calculation circuit 184 in FIG. 1. The calculation circuit 184 then calculates the distance between the object and the device 100 according to the data signals DA1-DA2 read at times 12, 14, and 16.

In some embodiments, the operations in the second mode of the device 100 in FIG. 1, i.e., the method 400, is referred to as a time-of-flight (TOF) mode. As described above, with the arrangements of the capacitors C1-C2 in FIG. 2 and the method 400, the detectable distance is able to be increased.

Figure 5:
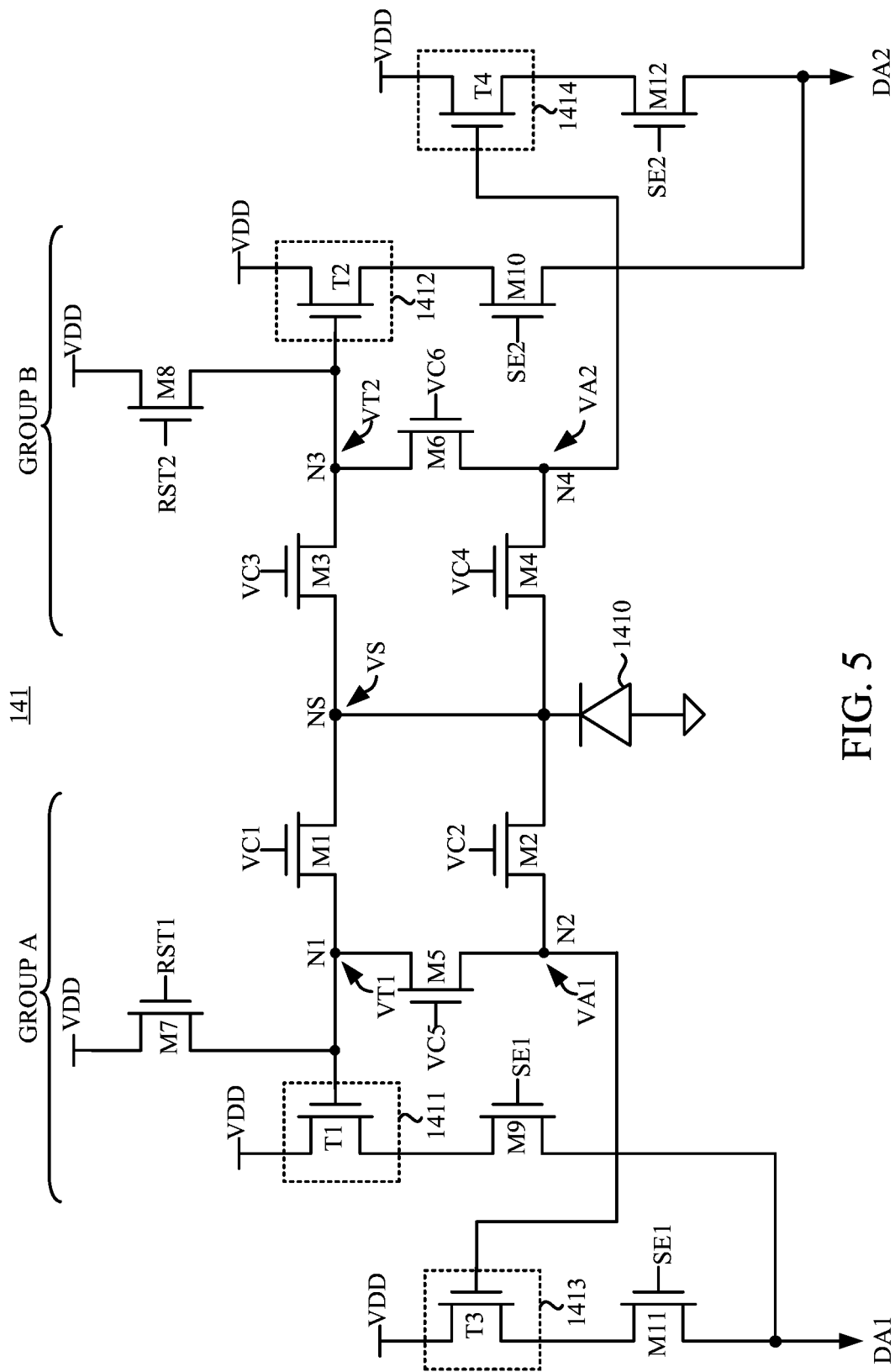
FIG. 5 is a schematic diagram of the pixel in FIG. 1, in accordance with various embodiments of the present disclosure.

FIG. 5 is a schematic diagram of the pixel 141 in FIG. 1, in accordance with various embodiments of the present disclosure. With respect to the embodiment of FIG. 2, like elements in FIG. 5 are designated with the same reference numbers for ease of understanding. Compared with the pixel 141 in FIG. 2, in some embodiments illustrated in FIG. 5, the pixel 141 further include output stages 1413 and 1414, and switches M11-M12. In some embodiments, the output stage 1413 operates with the output stage 1411 to generate the data signal DA1 according to the voltage level of the node N2, and the output stage 1414 operates with the output stage 1412 to generate the data signal DA2 according to the voltage level of the node N4. For illustration, the output stage 1413 includes a transistor T3, and the output stage 1414 includes a transistor T4. The connections and the operations of the switch M11 and the transistor T3 are similar with those of the switch M9 and the transistor T1. The connections and the operations of the switch M12 and the transistor T4 are similar with those of the switch M10 and the transistor T2. Thus, the repetitious descriptions are not given here. Compared with the pixel 141 in FIG. 2, the capacitors C1-C2 in FIG. 2 are effectively replaced by parasitic capacitances (not shown) of control terminals of the transistors T3-T4. By utilizing more output stages in the pixel 141, noises of the pixel 141 are able to be minimized.

Figure 6:
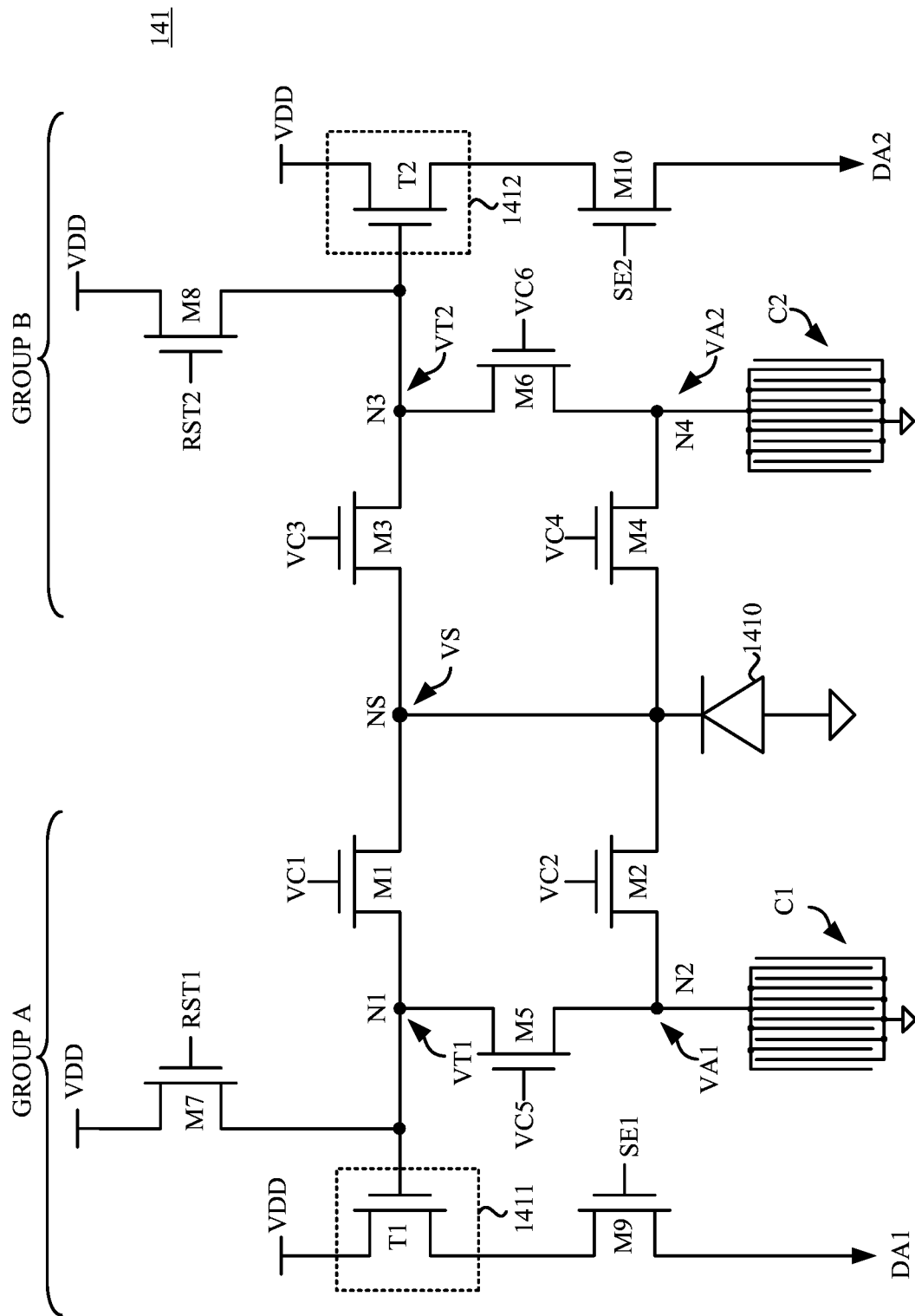
FIG. 6 is a schematic diagram of the pixel in FIG. 1, in accordance with various embodiments of the present disclosure.

FIG. 6 is a schematic diagram of the pixel 141 in FIG. 1, in accordance with various embodiments of the present disclosure. With respect to the embodiment of FIG. 2, like elements in FIG. 6 are designated with the same reference numbers for ease of understanding. As described above, the pixel 141 is able to be implemented by 3D CIS technology. Compared with the pixel 141 in FIG. 2, in some embodiments illustrated in FIG. 6, the capacitor C1 and the capacitor C2 are implemented with metal-oxide-metal (MOM) capacitor structure, and are disposed on the sensing unit 1410 by the 3D CIS technology. In some embodiments, the MOM capacitor structure effectively forms a diffraction grating structure that is able to filter out the non-necessary wavelengths of the light. Thus, in some embodiments, the pixel 141 illustrated in FIG. 6 is able to be applied to near infrared applications.

Figure 7:
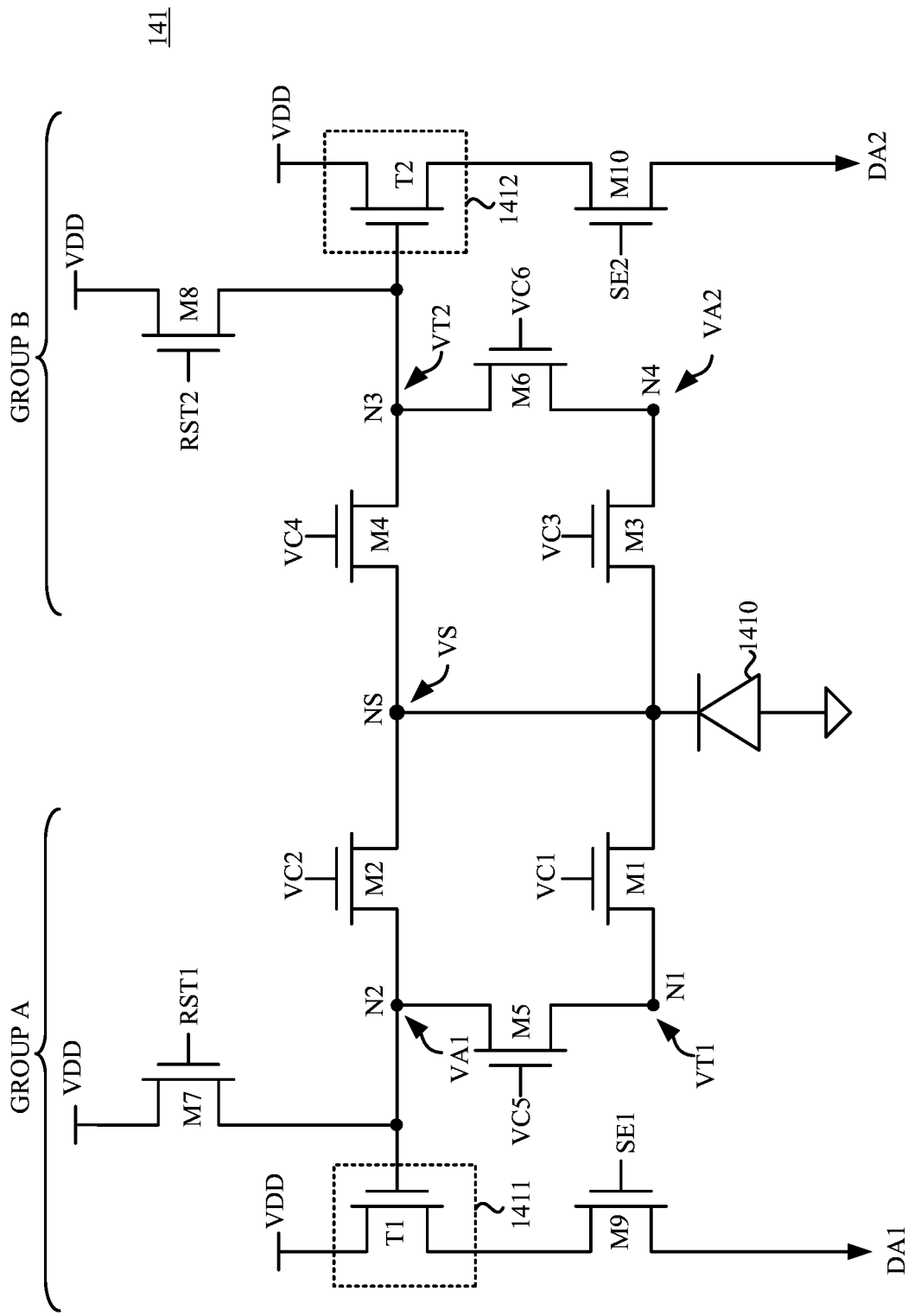
FIG. 7 is a schematic diagram of the pixel in FIG. 1, in accordance with various embodiments of the present disclosure.

FIG. 7 is a schematic diagram of the pixel 141 in FIG. 1, in accordance with various embodiments of the present disclosure. With respect to the embodiment of FIG. 2, like elements in FIG. 7 are designated with the same reference numbers for ease of understanding. Compared with the pixel 141 of FIG. 2, in some embodiments illustrated in FIG. 7, the position of the switch M1 and the position of the switch M2 are swapped, and the position of the switch M3 and the position of the switch M4 are swapped. For illustration, the second terminal of the switch M7, the control terminal of the transistor T1, and the first terminal of the switch M5 are coupled to the node N2 instead of the node N1. The second terminal of the switch M8, the control terminal of the transistor T2, and the first terminal of the switch M6 are coupled to the node N4 instead of the node N3.

Moreover, with the arrangements of the pixel 141 in FIG. 7, during the integration period IP in FIG. 3C, the charges are leaked from the sensing unit 1410 to the nodes N1 or N2, and then the data signal DA1 or DA2, indicating the charges leaked from the sensing unit 1410, is read by the column readout circuit 180 in FIG. 1 first. Afterwards, the switch M7 or M8 is turned on to reset the nodes N2 and/or N3, and then the data signal DA1 or DA2, indicating the reset level of the node N3 or N4, is read by the column readout circuit 180 in FIG. 1. Then, the switch M5 and/or M6 are turned on to transfer the charges from the node N1 or N2 to the node N2 or N4. The data signal DA1 or DA2, indicating the charges stored at the node N1 or N2, is then read by the column readout circuit 180 in FIG. 1.

For illustration, reference is now made to FIG. 3C and FIG. 7, with the arrangements and the operations in FIG. 7 described above, at time 4, the column readout circuit 180 reads the data signal DA2 that indicates the amount of the charges leaked from the sensing unit 1410. At time 6, the column readout circuit 180 reads the data signal DA2 that indicates the reset level. At time 8, the column readout circuit 180 reads the data signal DA2 that indicates the amount of the charges transferred from the node N1 or N2. In other words, compared with the pixel 141 in FIG. 2 with the operations illustrated in FIG. 3A-3C, the nodes N3 and N4 in FIG. 7 are reset to the reset level before the charges stored at the nodes N1-N2 are transferred to the nodes N3-N4.

Figure 8:
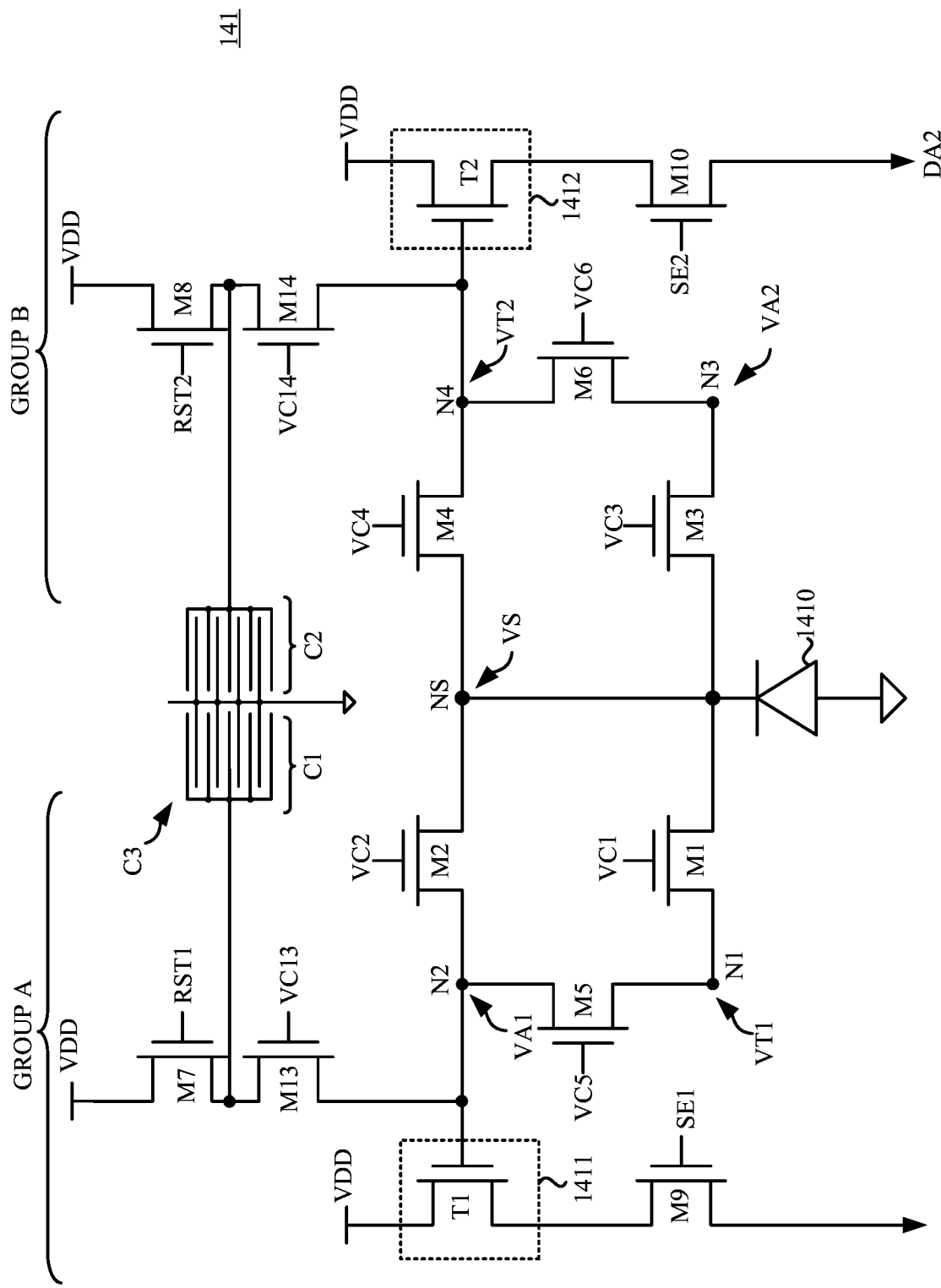
FIG. 8 is a schematic diagram of the pixel in FIG. 1, in accordance with various embodiments of the present disclosure.

FIG. 8 is a schematic diagram of the pixel 141 in FIG. 1, in accordance with various embodiments of the present disclosure. With respect to the embodiment of FIG. 2, like elements in FIG. 8 are designated with the same reference numbers for ease of understanding. Compared with the pixel 141 of FIG. 7, in some embodiments illustrated in FIG. 8, the pixel 141 further includes switches M13-M14 and a capacitor C3. A first terminal of the switch M13 is coupled to the second terminal of the switch M7, and a second terminal of the switch M13 is coupled to the node N2. A control terminal of the switch M13 is coupled to the driving circuit 162 to receive a control signal VC13. A first terminal of the switch M14 is coupled to the second terminal of the switch M8, and a second terminal of the switch M14 is coupled to the node N4. A control terminal of the switch M14 is coupled to the driving circuit 163 to receive a control signal VC14. The capacitor C3 is coupled between the first terminal of the switch M13 and the first terminal of the switch M14, and is configured to operate as the capacitor C1-C2, as illustrated above, with a common ground. During the global integration, the switches M13-M14 are turned on to allow extra charges to be leaked from the sensing unit 1410. The operations for the pixel 141 of FIG. 8 at the first mode and the second mode are similar with the operations described above. Thus, the repetitious descriptions are not given here.

In some embodiments, as illustrated in FIG. 8, the capacitor C3 is implemented with the MOM capacitor structure. As described above, the MOM capacitor structure is able to form the diffraction grating structure, to filter out the non-necessary wavelengths of the light. In some other embodiments, the capacitor C3 is shared by the group A and the group B, the area of the pixel 141 is able to be reduced, compared with the embodiments discussed above.

Furthermore, with reference to FIG. 1, in some embodiments, the column readout circuit 180 further includes switches MO. The switches MO are coupled between the second terminals of the switches M9 and M10 in FIG. 2. In some embodiments, the switch MO is configured to be turned on when the device 100 operates at the global shutter mode. As described in the method 300 above, when one of the group A and the group B in FIG. 2 is in the global integration event, another one of the group A and the group B is in the row-by-row readout event. Accordingly, with the arrangement of the switch MO, during the same period, the data signal DA1 or DA2 of the pixels 141 are transmitted to two comparators 181 for the read operation. Compared with the TOF mode in FIGS. 4A-4B, effectively, the data signals DA1-DA2 are able to be over-sampled by the column readout circuit 180. As a result, the read operations of the global shutter mode are able to be performed more efficiently.

Figure 9:
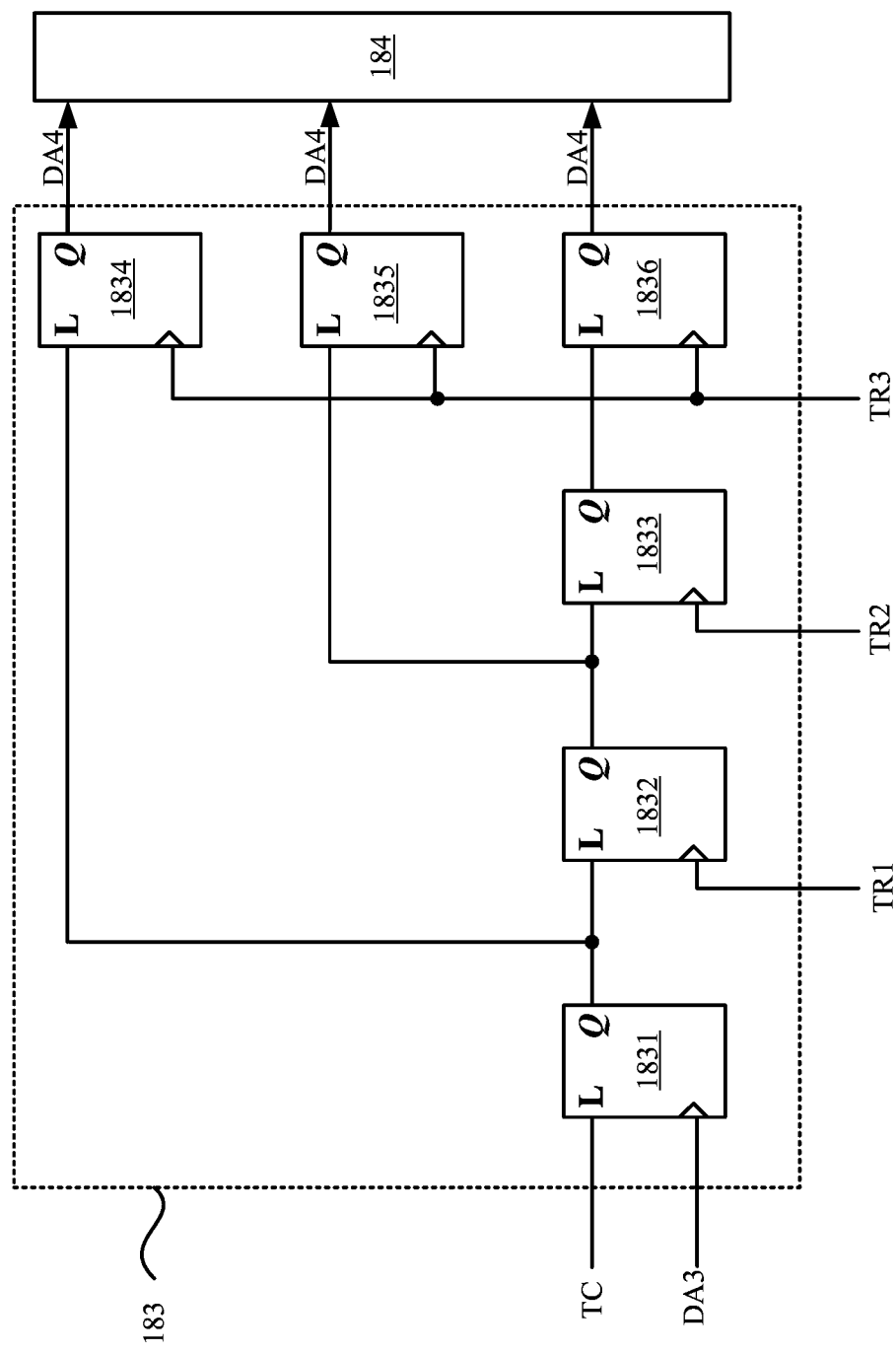
FIG. 9 is a schematic diagram of the data alignment circuit in FIG. 1, in accordance with various embodiments of the present disclosure.

FIG. 9 is a schematic diagram of the data alignment circuit 183 in FIG. 1, in accordance with various embodiments of the present disclosure. With respect to the embodiment of FIG. 1, like elements in FIG. 9 are designated with the same reference numbers for ease of understanding.

In some embodiments illustrated in FIG. 9, the data alignment circuit 183 includes latches 1831-1836. The latches 1831-1833 are coupled in cascade. The latch 1831 is configured to latch the data signal DA3 according to a corresponding count signal TC. The latch 1832 is configured to latch the data outputted from the latch 1831 according to a trigger signal TR1. The latch 1833 is configured to latch the data outputted from the latch 1832 according to a trigger signal TR2. The latch 1834 is configured to latch the data outputted from the latch 1831 according to a trigger signal TR3, and then output the latched data as the data signal DA4 to the calculation circuit 184. The latch 1835 is configured to latch the data outputted from the latch 1832 according to the trigger signal TR3, and then output the latched data as the data signal DA4 to the calculation circuit 184. The latch 1836 is configured to latch the data outputted from the latch 1833 according to the trigger signal TR3, and then to output the latched data as the data signal DA4 to the calculation circuit 184. With such arrangements, the data alignment circuit 183 is able to simultaneously transfer the different values of the data signals DA4, which are read at different timings, to the calculation circuit 184, in order to calculate the information of the captured image.

For example, by utilizing the data alignment circuit 183 in FIG. 9, the data signal DA2 read at times 4, 6, and 8 in FIG. 3C, are able to be effectively transferred to the calculation circuit 184. Similarly, by utilizing the data alignment circuit 183 in FIG. 9, the data signals DA1-DA2 read at times 12, 14, and 16, are able to be effectively transferred to the calculation circuit 184.

In this document, the term "coupled" may also be termed as "electrically coupled," and the term "connected" may be termed as "electrically connected." "Coupled" and "connected" may also be used to indicate that two or more elements cooperate or interact with each other.

In some embodiments, a circuit is disclosed that includes a sensing unit, a first group of switching units, a second group of switching units, a first capacitive unit, and a readout circuit. The sensing unit is configured to receive light and generate a sensing voltage at a sensing node in response to the light. The first group of switching units is coupled to the sensing node, and configured to generate a first transfer voltage to a first node and generate a first auxiliary voltage to a second node. The second group of switching units is coupled to the sensing node, and configured to generate a second transfer voltage to a third node and generate a second auxiliary voltage to a fourth node. The first capacitive unit is coupled to the first group of switching units, and configured to store charges generated from the sensing unit. The readout circuit is configured to read at least one of the first transfer voltage and the first auxiliary voltage, and read at least one of the second transfer voltage and the second auxiliary voltage.

Also disclosed is a device that includes pixels. Each of the pixels includes a sensing unit, a first group of switches, a second group of switches, and a first capacitive unit. The sensing unit is configured to accumulate charges at a sensing node in response to light. The first group of switching units is configured to generate a first transfer voltage to a first node, and generate a first auxiliary voltage to a second node. The second group of switching units is configured to generate a second transfer voltage to a third node, and generate a second auxiliary voltage to a fourth node. At least one of the first transfer voltage and the first auxiliary voltage is configured to be read by a readout circuit, and at least one of the second transfer voltage and the second auxiliary voltage is configured to be read by the readout circuit. When in a first mode, the first group of switching unit is configured to transfer a part of the charges to the first capacitive unit.

Also disclosed is a method that includes the operation below. A sensing voltage is generated at a sensing node by a sensing unit in response to light. A first transfer voltage is generated to a first node by a first group of switching units that is coupled to the sensing node. A first auxiliary voltage is generated to a second node by the first group of switching units. A second transfer voltage is generated to the third node by a second group of switching units that is coupled to the sensing node. A second auxiliary voltage is generated to a fourth node by the second group of switching units. In a first mode, charges are accumulated by a first capacitive unit in response to generating the sensing voltage. At least one of the first transfer voltage and the first auxiliary voltage is read by a readout circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit, comprising:
a sensing unit configured to receive light and generate a sensing voltage at a sensing node in response to the light;
a first group of switching units coupled to the sensing node, wherein the first group of switching units comprises:
a first switching unit including a first terminal coupled to the sensing node and a second terminal coupled to a first node;

a second switching unit including a first terminal coupled to the sensing node and a second terminal coupled to a second node; and a third switching unit including a first terminal coupled to the first node and a second terminal coupled to the second node;

wherein the first group of switching units is configured to generate a first transfer voltage to the first node and generate a first auxiliary voltage to the second node;

a second group of switching units coupled to the sensing node, and configured to generate a second transfer voltage to a third node and generate a second auxiliary voltage to a fourth node;

a first capacitive unit coupled to the first group of switching units, and configured to store charges generated from the sensing unit; and a readout circuit configured to read at least one of the first transfer voltage and the first auxiliary voltage, and read at least one of the second transfer voltage and the second auxiliary voltage.

2. The circuit of claim 1, wherein the second group of switching units comprise a fourth switching unit and a fifth switching unit, wherein the fourth switching unit is coupled between the sensing node and the third node, and the fifth switching unit is coupled between the sensing node and the fourth node.

3. The circuit of claim 2, wherein when the sensing unit receives the light in a first mode, the first group of switching units and the second group of switching units are configured to be alternatively turned on, wherein when the first group of switching units is turned on, a driver is configured to generate a first control signal having a first voltage level to drive the first switching unit, and generate a second control signal having a second voltage level to drive the second switching unit, and the first voltage level is different from the second voltage level.

4. The circuit of claim 2, wherein when the sensing unit receives the light in a second mode, the first switching unit, the second switching unit, and the fourth switching unit are configured to receive first control signals having a first voltage level, the fifth switching unit is configured to receive a second control signal having a second voltage level, and the first voltage level is different from the second voltage level.

5. The circuit of claim 1, further comprising:
a fourth switching unit coupled between the third node and the fourth node.

6. The circuit claim 5, further comprising:
a fifth switching unit coupled between a power source and the first node;
a sixth switching unit coupled between the power source and the third node;
a first output stage configured to generate a first data signal in response to a voltage level of the first node;
a seventh switching unit configured to transmit the first data signal to the readout circuit according to a first selection signal;
a second output stage configured to generate a second data signal according to a voltage level of the third node; and
an eighth switching unit configured to transmit the second data signal to the readout circuit according to a second selection signal.

7. The circuit claim 5, further comprising:
a fifth switching unit coupled between a power source and the second node;

a sixth switching unit coupled between the power source and the fourth node;
a first output stage configured to generate a first data signal in response to a voltage level of the second node;
a seventh switching unit configured to transmit the first data signal to the readout circuit according to a first selection signal;
a second output stage configured to generate a second data signal according to a voltage level of the fourth node; and
an eighth switching unit configured to transmit the second data signal to the readout circuit according to a second selection signal.

8. The circuit of claim 1, further comprising:
a second capacitive unit coupled to the second group of switching units.

9. The circuit of claim 8, wherein the first capacitive unit is coupled between the second node and a ground, and the second capacitive unit is coupled between the fourth node and the ground.

10. A device, comprising:
a plurality of pixels, each of the pixels comprising:
a sensing unit configured to accumulate charges at a sensing node in response to light;
a first group of switching units comprising:
a first switching unit having a first terminal coupled to the sensing node and a second terminal coupled to a first node;
a second switching unit having a first terminal coupled to the sensing node and a second terminal coupled to a second node; and
a third switching unit having a first terminal coupled to a power source and a second terminal coupled to the first node;
wherein the first group of switching units is configured to generate a first transfer voltage to the first node, and generate a first auxiliary voltage to the second node, wherein at least one of the first transfer voltage and the first auxiliary voltage is configured to be read by a readout circuit;
a second group of switching units configured to generate a second transfer voltage to a third node, and generate a second auxiliary voltage to a fourth node, wherein at least one of the second transfer voltage and the second auxiliary voltage is configured to be read by the readout circuit; and
a first capacitive unit,
wherein when in a first mode, the first group of switching units is configured to transfer a part of the charges to the first capacitive unit.

11. The device of claim 10, wherein the second group of switching units comprise a fourth switching unit and a fifth switching unit, the fourth switching unit is coupled between the sensing node and the third node, and the fifth switching unit is coupled between the sensing node and the fourth node.

12. The device of claim 11, wherein when the sensing unit receives the light in a second mode, the first switching unit, the second switching unit, and the fourth switching unit are configured to receive first control signals having a first voltage level, the fifth switching unit is configured to receive a second control signal having a second voltage level, and the first voltage level is different from the second voltage level.

13. The device of claim 11, wherein the first group of switching units further comprises a sixth switching unit coupled between the first node and the second node, and the second group of switching units further comprises a seventh switching unit coupled between the third node and the fourth node.

14. The device of claim 13, further comprising:
an eighth switching unit coupled between the power source and the third node;
a first output stage configured to generate a first data signal in response to a voltage level of the first node;
a ninth switching unit configured to transmit the first data signal to the readout circuit according to a first selection signal;
a second output stage configured to generate a second data signal according to a voltage level of the third node; and
a tenth switching unit configured to transmit the second data signal to the readout circuit according to a second selection signal.

15. The device of claim 13, further comprising:
an eighth switching unit coupled between the power source and the second node;
a ninth switching unit coupled between the power source and the fourth node;
a first output stage configured to generate a first data signal according to a voltage level of the second node;
a tenth switching unit configured to transmit the first data signal to the sensing unit according to a first selection signal;
a second output stage configured to generate a second data signal according to a voltage level of the fourth node; and
an eleventh switching unit configured to transmit the second data signal to the readout circuit according to a second selection signal.

16. The device of claim 10, further comprising:
a second capacitive unit coupled between the fourth node and a ground,
wherein the first capacitive unit is coupled between the second node and the ground.

17. A method, comprising:
generating a sensing voltage at a sensing node, by a sensing unit, in response to light;
generating a first transfer voltage and a first auxiliary voltage, by a first group of switching units, to a first node and a second node, respectively, wherein the first group of switching units comprises:
a first switching unit including a first terminal coupled to the sensing node and a second terminal coupled to the first node;
a second switching unit including a first terminal coupled to the sensing node and a second terminal coupled to the second node; and
a third switching unit including a first terminal coupled to the first node and a second terminal coupled to the second node;
generating a second transfer voltage and a second auxiliary voltage, by a second group of switching units, to a third node and a fourth node, respectively, wherein the second group of switching units is coupled to the sensing node;
accumulating charges, in a first mode, by a first capacitive unit, in response to generating the sensing voltage; and
reading, by a readout circuit, at least one of the first transfer voltage and the first auxiliary voltage.

18. The method of claim 17, further comprising:
accumulating charges, in the first mode, by a second capacitive unit, in response to generating the sensing voltage.

19. The method of claim 17, wherein in the first mode, generating the sensing voltage comprises alternately turning on the first group of switching units and the second group of switching units by a driver, wherein alternatively turning on the first group of switching units and the second group of switching units comprises:
generating a first control signal having a first voltage level, by the driver, to drive the first switching unit of the first group of switching units when the first group of switching units are turned on; and
generating a second control signal having a second voltage level, by the driver, to drive the second switching unit of the first group of switching units when the first group of switching units is turned on.

20. The method of claim 17, wherein in a second mode, generating the sensing voltage comprises:
generating third control signals having a third voltage level, by a driver, to drive the first switching unit of the first group of switching units, the second switching unit of the first group of switching units, and a fourth switching unit of the second group of switching units; and
generating a fourth control signal having a fourth voltage level, by the driver, to drive a fifth switching unit of the second group of switching units, and the third voltage level being different from the fourth voltage level,
wherein the fourth switching unit is coupled between the sensing node and the third node, and the fifth switching unit is coupled between the sensing node and the fourth node.

* * * * *